US007614141B2

(12) United States Patent
Douriet et al.

(10) Patent No.: US 7,614,141 B2
(45) Date of Patent: Nov. 10, 2009

(54) FABRICATING SUBSTRATES HAVING LOW INDUCTANCE VIA ARRANGEMENTS

(75) Inventors: Daniel Douriet, Round Rock, TX (US);
Anand Haridass, Austin, TX (US);
Andreas Huber, Holzgerlingen (DE);
Colm B. O'Reilly, Austin, TX (US);
Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 11/355,713

(22) Filed: Feb. 16, 2006

(65) Prior Publication Data

US 2007/0187468 A1 Aug. 16, 2007

(51) Int. Cl.
*H01K 3/10* (2006.01)
(52) U.S. Cl. ............... 29/825; 29/846; 257/774; 716/10; 716/15
(58) Field of Classification Search .......... 29/825, 29/830–832, 846, 852; 174/255, 262; 257/691, 257/728, 774; 361/794; 430/311; 712/5, 712/10, 11, 15
See application file for complete search history.

(56) References Cited

U.S. PATENT DOCUMENTS

| 5,292,624 | A * | 3/1994 | Wei .................. 430/311 |
| 6,417,463 | B1 * | 7/2002 | Cornelius et al. .......... 174/263 |
| 6,617,243 | B1 * | 9/2003 | Weekly ................... 29/830 |

FOREIGN PATENT DOCUMENTS

EP        1111969 A1     6/2001

* cited by examiner

*Primary Examiner*—Donghai D. Nguyen
(74) *Attorney, Agent, or Firm*—Stephen J. Walder, Jr.; Diana R. Gerhardt (57) ABSTRACT

A low inductance via arrangement for multilayer ceramic (MLC) substrates is provided. With the MLC substrate and via arrangement of the illustrative embodiments, the via-field inductance for a given contact pad array is reduced. This reduction is achieved by the introduction of T-jogs and additional vias. These T-jogs and additional vias form additional current paths that cause additional parallel inductances that reduce the via-field inductance. In one illustrative embodiment, the additional T-jogs and vias are added to a center portion of a contact pad array. The T-jogs are comprised of two jogs in a wiring layer of the MLC, each jog being toward a via associated with an adjacent contact pad in the contact pad array. These additional T-jogs and vias form additional current loops parallel to the existing ones which thus, reduce the total inductance of the via-field.

7 Claims, 6 Drawing Sheets

FABRICATING SUBSTRATES HAVING LOW INDUCTANCE VIA ARRANGEMENTS

BACKGROUND

1. Technical Field

The present application relates generally to an improved integrated circuit device. More specifically, the present application is directed to a low inductance via arrangement for multilayer ceramic substrates.

2. Description of Related Art

A decoupling network is an electrical circuit arrangement that prevents signals that are applied to one portion of the electrical circuit from affecting other devices or portions of the electrical circuit to which the signal is not applied. The use of such decoupling networks is important in the formation of integrated circuit devices which, because of their compact and ever decreasing size, are prone to having one portion of the integrated circuit negatively affecting other portions of the integrated circuit.

A general goal in the design of a decoupling network is the reduction of inductance. Inductance is a parasitic property of the decoupling network that limits the effect of capacitors at higher frequencies. In a multilayer ceramic package of an integrated circuit device, the inductance has three main contributors: (1) the capacitor's internal inductance; (2) the via-field inductance; and (3) the power plane inductance. With regard to the influence of the via-field inductance on the overall inductance of the capacitor, an exemplary capacitor connection arrangement will be discussed.

Figure 1:
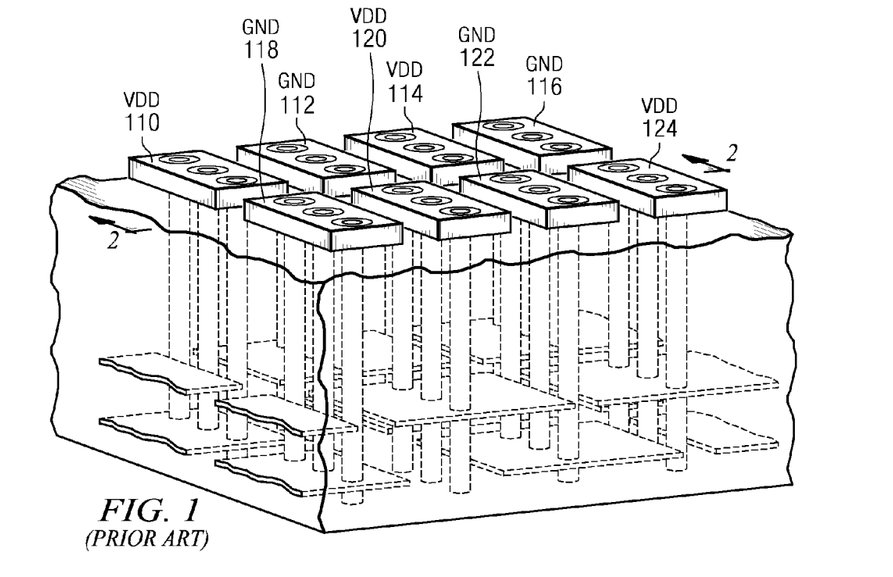
FIG. 1 is an exemplary diagram of a known arrangement for connecting a top surface metallization (TSM) capacitor of a multilayer ceramic (MLC) substrate to ground (GND) and voltage (VDD) planes of the MLC.

FIG. 1 is an exemplary diagram of a known arrangement for connecting a top surface metallization (TSM) capacitor of a multilayer ceramic (MLC) substrate to ground and voltage planes of the MLC. As shown in FIG. 1, the capacitor has eight surface pad connections 110-124 assigned to voltage (VDD) or ground (GND) in an alternating pattern. For example, in the depicted arrangement, surface pad connections 110, 114, 120, and 124 are assigned to the VDD net while surface pad connections 112, 116, 118 and 122 are assigned to the GND net. That is, vias for surface pads connections that are assigned to the VDD net selectively contact the VDD connections in the VDD planes while selectively avoiding contact with the GND nets in the GND planes of the MLC substrate. Similarly, the vias for surface pad connections that are assigned to the GND net selectively contact the GND connections in the GND planes while selectively avoiding contact with the VDD nets in the VDD planes of the MLC substrate. Each surface pad connection 110-124 is attached to three vias, e.g., vias 132-136, that connect the surface pads 110-124 to the internal VDD and GND planes of the MLC.

Figure 2:
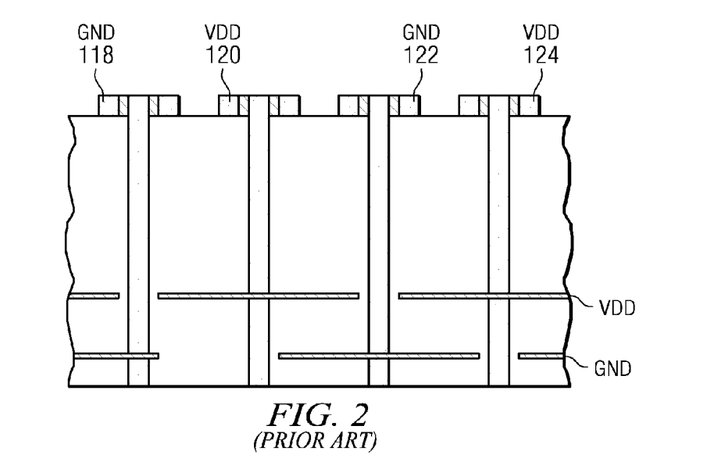
FIG. 2 is an exemplary diagram illustrating a cross-sectional view of the known arrangement in FIG. 1 which illustrates the vias for connecting the TSM capacitor to internal planes.

FIG. 2 is an exemplary diagram illustrating a cross-sectional view of the known arrangement in FIG. 1 which illustrates the vias for connecting the TSM capacitor to internal planes. As shown, the standard implementation utilizes straight vias that connect the capacitor's TSM pad connections 110-124 to the VDD and GND plane meshes.

Inductance is a property of magnetic flux generated by a current. For adjacent conductors having oppositely directed current flows, the smaller relative spacing between the conductors reduces the per unit length inductance exhibited by each of such adjacent conductors. Thus, straight vias situated at relatively large surface pad spacing distances represent the least beneficial arrangement of vias with regard to reducing the inductance of the capacitor since the distance between vias is maximized in such an arrangement.

SUMMARY

In view of the above, it would be beneficial to have a multilayer ceramic (MLC) substrate in which the configuration of the vias minimizes the inductance introduced by the via-field and thereby, as a secondary affect, increases the capacitive effect. Moreover, it would be beneficial to have an integrated circuit device that utilizes such a via configuration. The illustrative embodiments provide such a multilayer ceramic substrate and integrated circuit device.

The illustrative embodiments take advantage of two primary characteristics of inductance. First, parallel paths, i.e., inductors that are in parallel, divide. That is, if there are two parallel inductors having an inductance of 1, the resulting combined inductance is 0.5. The second characteristic is that the inductance decreases in relative proportion to the log of the distance between the current paths. Thus, using these two characteristics, by introducing additional parallel current paths in the via arrangement of a MLC substrate, the inductance of the via field may be reduced and the capacitive effect may be increased.

Thus, with the MLC substrate and via arrangement of the illustrative embodiments, the via-field inductance for a given contact pad array is reduced by the introduction of T-jogs and additional vias in the MLC substrate. These T-jogs and additional vias form additional current paths that cause additional parallel inductances that reduce the via-field inductance. In addition, these T-jogs reduce the area between current paths and thereby, further reduce the inductance of the via field.

In one illustrative embodiment, the additional T-jogs and vias are added to a center or inner portion of a contact pad array. The T-jogs are comprised of two jogs in a wiring layer of the MLC, each jog being toward a via associated with an adjacent contact pad in the contact pad array. These additional T-jogs and vias form additional current paths parallel to the existing ones which thus, reduce the total inductance of the via-field.

In one illustrative embodiment, a substrate is provided that comprises a plurality of layers and a plurality of vias extending through the plurality of layers from a surface of the substrate and selectively coupled to designated layers in the plurality of layers. At least one via of the plurality of vias may have a T-jog configuration in which the at least one via has two jogs. A first jog of the two jogs may be formed in a direction parallel to the plurality of layers towards a first adjacent via of the plurality of vias and a second jog of the two jogs may be formed in a direction parallel to the plurality of layers towards a second adjacent via of the plurality of vias. The designated layers may comprise at least one of a power layer or a ground layer. Furthermore, the substrate may be provided as part of an integrated circuit device.

The plurality of vias may be associated with one or more surface pads for connecting a surface metallization circuit element to the designated layers in the plurality of layers. The surface metallization circuit element may be a capacitor, for example.

The first jog and second jog of the T-jog configuration may be formed in a wiring layer of the plurality of layers. The wiring layer may be a wiring layer closest to a surface of the substrate upon which one or more surface pads, associated with the plurality of vias, are provided for connecting a surface metallization circuit element to the designated layers in the plurality of layers.

The plurality of vias may comprise at least three vias. The T-jog configuration may be associated with an inner via of the at least three vias. The T-jog may introduce at least one additional current path in a via field of the substrate that reduces an inductance of the via field.

In another illustrative embodiment, an integrated circuit device is provided that comprises a multilayer ceramic substrate and an integrated circuit element coupled to the multilayer ceramic substrate on a surface of the multilayer ceramic substrate using at least one surface pad. The multilayer ceramic substrate may comprise similar combinations of elements as described above with regard to the substrate illustrative embodiment.

In yet another illustrative embodiment, a method of fabricating an integrated circuit substrate is provided. The method may comprise providing a plurality of layers; and providing a plurality of vias extending through the plurality of layers from a surface of the substrate to designated layers in the plurality of layers. At least one via of the plurality of vias may have a T-jog configuration in which the at least one via has two jogs. A first jog of the two jogs may be formed in a direction parallel to the plurality of layers towards a first adjacent via of the plurality of vias and a second jog of the two jogs may be formed in a direction parallel to the plurality of layers towards a second adjacent via of the plurality of vias. The first jog and second jog of the T-jog configuration may be formed in a wiring layer of the plurality of layers. The wiring layer may be a wiring layer closest to a surface of the substrate upon which one or more surface pads, associated with the plurality of vias, are provided for connecting a surface metallization circuit element to the designated layers in the plurality of layers. The T-jog may introduce at least one additional current path in a via field of the substrate that reduces an inductance of the via field.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

As previously described above, conventionally, vias are formed in a multilayer ceramic (MLC) substrate as straight via connections between a surface pad connection and an internal plane, e.g., the internal voltage (VDD) or ground (GND) planes. Such an arrangement does not minimize the inductance generated by the vias, i.e., the via-field inductance, since the distance between the vias tends to be maximized in such an arrangement.

One solution to reduce the inductance generated by the via-field is to introduce single "jogs" in the vias so as to bring them closer together, i.e. reduce the distance between the vias. These single "jogs" are essentially portions of the vias that run perpendicular to the conventional via, i.e. parallel to the internal planes of the MLC. The "jogs" may be formed as horizontal wirings in a wiring plane of the MLC.

Figure 3A:
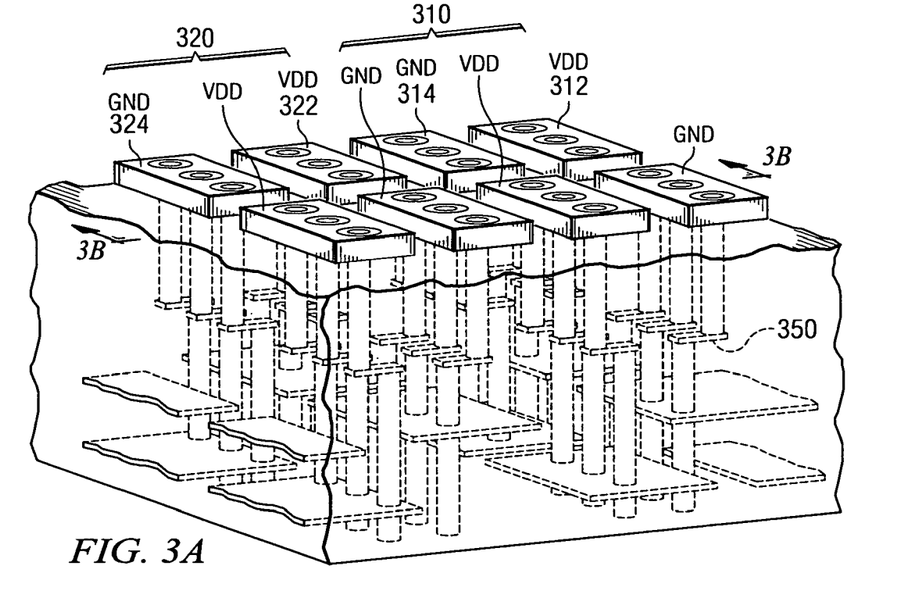
FIGS. 3A and 3B are exemplary diagrams illustrating the arrangement of the vias in accordance with a known alternative configuration.
Figure 3B:
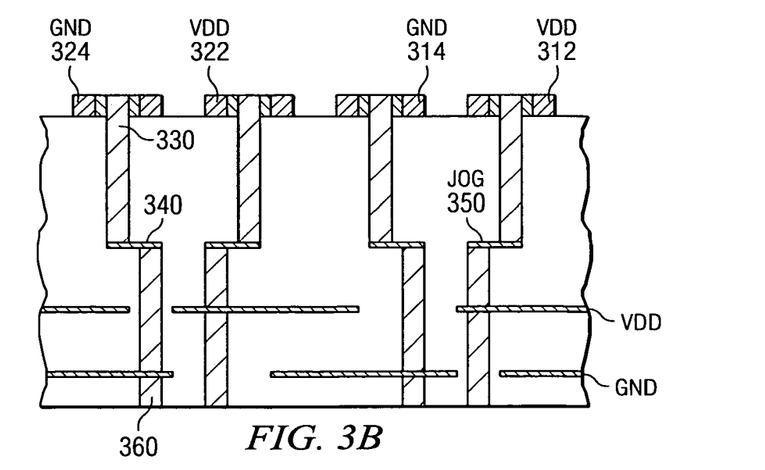

FIGS. 3A and 3B are exemplary diagrams illustrating the arrangement of the vias in accordance with a known alternative configuration. FIG. 3A is a conceptual isometric view of the via arrangement from a top surface of a MLC substrate. It should be noted that FIG. 3A is only conceptual and that the actual physical MLC substrate may differ somewhat from the depiction with regard to dimensions and configuration but will conceptually be consistent with the depiction in FIG. 3A. FIG. 3B is a cross-sectional view of the MLC substrate. As shown in FIGS. 3A and 3B, an alternative to straight vias is to introduce a single "jog" in the via so as to reduce the distance between the vias. Pairs of vias 310 and 320 are jogged towards each other so that the distance between the vias is reduced and thus, the inductance is reduced.

Taking via pair 310 as exemplary, the first via 312 is jogged towards the via 314. Similarly, the via 314 is jogged towards the via 312. These "jogs" are generated by stopping formation of a first portion 330 of the via in a direction perpendicular to the MLC substrate planes, e.g., the vertical direction in the depicted example, and generating a second portion 340 of the via in a parallel direction to the MLC substrate planes, e.g., the horizontal direction in the depicted example. The second portion 340 is formed as a wire connection in a wiring layer 350 of the MLC substrate, i.e. the metallization layer generally referred to in the diagram as the "JOG" layer 350. The JOG layer 350 can be used to provide wiring for all voltages and signals. The wire connection runs in a direction from the termination of the first portion 330 of the via towards the other via 314 in the via pair 310. The formation of ceramic layers, metallization layers, and vias in a MLC is generally known in the art and thus, a detailed description is not provided herein.

The wire connection is "jogged" as close to a similar "jog" in the other via 314 as possible taking into consideration manufacturing limits and yield considerations. At an appropriate distance from the other via 314, formation of the second portion 340 is terminated and a third portion 360 of the via 312 is formed in a perpendicular direction to the planes of the MLC substrate. This third portion 360 runs perpendicular to the planes of the MLC. The vias 312 and 314 are selectively connected to appropriate planes to which the surface pad associated with the via is assigned, e.g., either the VDD or GND plane of the MLC substrate.

By introducing a "jog" in the formation of the vias such as shown in FIGS. 3A and 3B, the inductance due to the via-field is reduced due to the reduction in distance between the vias. For example, if the straight via arrangement of FIG. 2 has a via-field inductance of L1, then the jogged via arrangement of FIGS. 3A and 3B has a reduced via-field inductance L2 due to the reduced distance between the current paths generated by the pairs of vias. As mentioned previously above, the inductance L2 is reduced in comparison to L1 in relative proportion to the log of the distance between the current paths.

While such a reduction in inductance is beneficial to the operation of the TSM capacitor (a reduction in inductance has a secondary affect of increasing the capacitive effect), additional reduction in inductance may be achieved through use of an alternative illustrative embodiment of the present invention. In essence, with the alternative illustrative embodiment described hereafter, additional parallel current paths are generated that are not present in the single "jog" arrangement described above with reference to FIGS. 3A and 3B. These additional parallel current paths serve to reduce the inductance of the via fields even further than in the single "jog" arrangement.

The illustrative embodiment described hereafter take advantage of two primary characteristics of inductance. First, parallel paths, i.e., inductors that are in parallel, divide. The second characteristic is that the inductance decreases in relative proportion to the log of the distance between the current paths. Thus, using these two characteristics, by introducing additional parallel current paths in the via arrangement of a MLC substrate, the inductance of the via field may be reduced and the capacitive effect may be increased.

Figure 4A:
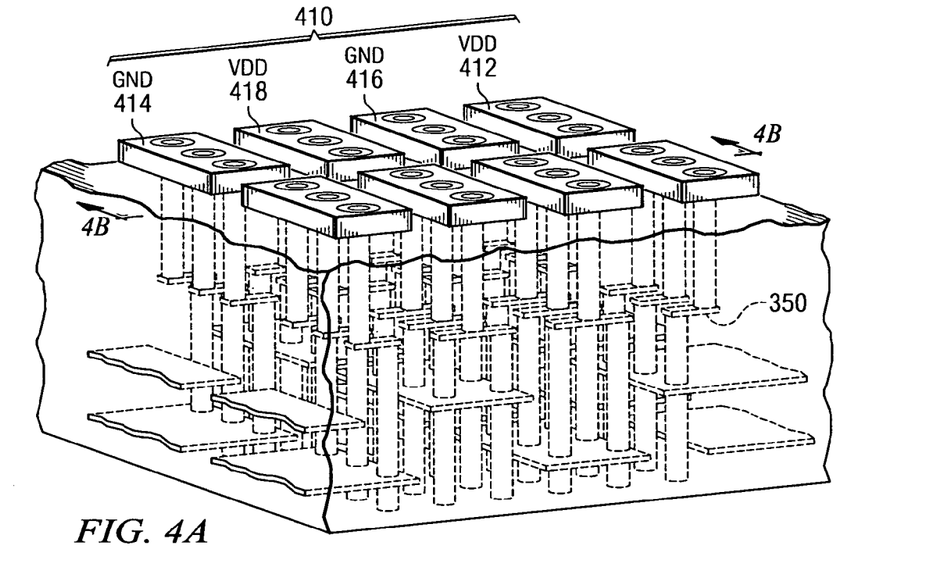
FIG. 4A is an exemplary diagram illustrating an isometric view of an arrangement for connecting a TSM capacitor of a MLC substrate to GND and VDD planes using a T-jog configuration in accordance with an illustrative embodiment.
Figure 4B:
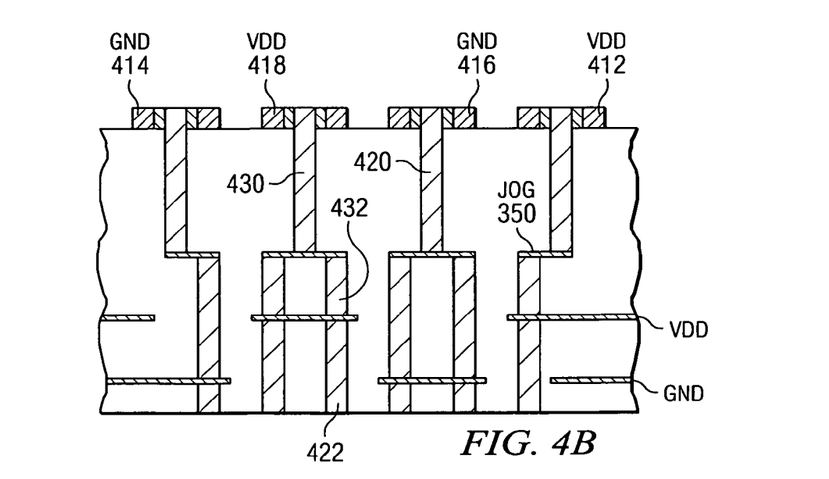
FIG. 4B is an exemplary diagram illustrating a cross-sectional view of the arrangement of FIG. 4A which illustrates the T-jog vias for connecting the TSM capacitor to internal planes in accordance with an illustrative embodiment.

FIG. 4A is an exemplary diagram illustrating a conceptual isometric view of an arrangement for connecting a TSM capacitor of a MLC substrate to GND and VDD planes using a "T-jog" configuration in accordance with an alternative illustrative embodiment. It should be noted that FIG. 4A is only conceptual and that the actual physical MLC substrate may differ somewhat from the depiction with regard to dimensions and configuration but will conceptually be consistent with the depiction in FIG. 4A. FIG. 4B is an exemplary diagram illustrating a cross-sectional view of the arrangement of FIG. 4A which illustrates the "T-jog" vias for connecting the TSM capacitor to internal planes in accordance with an illustrative embodiment.

As shown in FIGS. 4A and 4B, in an alternative illustrative embodiment, additional "jogs" and vias are added to the via-field at the vias associated with surface pads that are internal to a group of surface pads. These additional "jogs" and vias form "T-jogs" (named for the "T" cross-sectional appearance of the jogs in the vias). The "T-jogs" form additional current paths which cause additional parallel inductances and thus, reduce the overall via-field inductance.

As shown in FIG. 4A, a group or array of surface pads 410 comprises two outer surface pads 412 and 414, and two inner surface pads 416 and 418. Using the jog arrangement of FIGS. 3A and 3B, a jog is introduced in the via associated with surface pad 412 that extends towards the via of surface pad 416. Similarly, a jog in the via associated with surface pad 416 is introduced that extends toward the via of surface pad 412. Similar jogs are generated with regard to vias associated with surface pads 414 and 418. These jogs are similar to the jogs introduced in the structure depicted in FIG. 3B described above.

Because inductance is a product of electrical loops, i.e. current paths in close proximity that have opposite directions of current flow, the additional jogs and vias for forming the "T-jogs" are only added to the inner surface pad vias, i.e. surface pads 416 and 418. Thus, as shown in FIG. 4B, an additional jog 420 and via 422 is added to the via associated with surface pad 416. The jog 420 extends towards the via associated with the other inner surface pad 418. Similarly, an additional jog 430 and via 432 are added to the via associated with surface pad 418. The jog 430 extends towards the via associated with the other inner surface pad 416. The additional jogs 420 and 430 give rise to an additional electrical loop in the via configuration thereby introducing an additional parallel inductance. This additional parallel inductance serves to divide the inductance affects of other electrical loops in the via field, thereby reducing the overall inductance of the via field.

It will be appreciated that additional jogs are not added to the vias associated with the outer surface pads since such addition would not result in an additional electrical loop being created. In other words, adding an additional jog and via to the vias of the outer surface pads would not result in any reduction in inductance of the via-field.

The additional jogs 420, 430 and vias 422, 432 introduced by this alternative illustrative embodiment are formed in a similar manner as the jogs and vias described previously with regard to FIGS. 3A and 3B. That is, the vias are formed in a manner generally known in the art with the exception that formation of the via is halted at a wiring layer in the MLC substrate at which time a wired T-jog is formed in the wiring layer, i.e. parallel to the wiring layer, so as to bring the vias of neighboring, or adjacent, surface pads closer together. The formation of the via in a direction perpendicular to the layers or planes is then continued down to a particular layer associated with the surface pad, e.g., the VDD or GND planes for both branches of the T-jog.

Preferably, the jogs of the T-jog via arrangement of FIGS. 4A and 4B are introduced at an earliest wiring layer in the MLC substrate. In other words, if multiple wiring layers are provided in the MLC substrate, the jogs of the illustrative embodiments are introduced in a first wiring layer encountered during via formation, i.e. the wiring layer closest to the surface upon which the surface pads are formed. In the depicted example, the jogs are introduced at the first layer of the MLC substrate, from the top surface, that allows horizontal wiring.

As a result of the introduction of the additional jogs and vias to the inner surface pad vias, an additional current path is created between the vias of surfaces pads 416 and 418 that further reduces the inductance due to the via-field. For example, in one particular structure, if the inductance of the straight via arrangement of FIG. 2 is L, the inductance of the jogged via arrangement of FIGS. 3A and 3B may be L/2. Moreover, the inductance of the T-jogged via arrangement of FIGS. 4A and 4B with such a structure may be L/3 due to the additional parallel current paths.

Table 1 below provides exemplary via-field inductance obtained from the various arrangements of vias shown in FIGS. 2, 3A, 3B, 4A and 4B. In each case, the configuration of the multilayer ceramic substrate was maintained consistent with the other cases with the exception of the via configuration, which was provided as shown in Table 1.

TABLE 1

Exemplary Reduction in Inductance

| | Via Configuration | Inductance | Improvement over "A" | Improvement over "B" |
|---|---|---|---|---|
| A | Straight | 109.0e−6 μH | — | — |
| B | Jogged | 88.0e−6 μH | −19.3% | — |
| C | T-Jogged | 71.0e−6 μH | −34.9% | −19.3% |

From the above, it can be seen that the jogged via arrangement results in a 19% reduction in via-field inductance over the straight via configuration. Moreover, the T-jogged via configuration results in a 35% reduction in via-field inductance over the straight via configuration. Furthermore, the T-jogged via configuration results in an additional 19% reduction in via-field inductance over the jogged configuration. This means that the T-jogged configuration doubles the improvement obtained from the jogged via configuration. This additional benefit is obtained with a relatively inexpensive configuration modification.

It should be noted that while the illustrative embodiments have been described with regard to a particular number of surface pad connections and a particular number and vias per surface pad, the present invention is not limited to such. Rather, any number and arrangement of surface pad connections may be used without departing from the spirit and scope of the present invention. Moreover, any number of vias per surface pad may be used without departing from the spirit and scope of the present invention.

Furthermore, while the illustrative embodiments have been described with particular application to via fields for connecting a TSM capacitor to GND and VDD planes of a MLC substrate, the present invention is not limited to such. Rather, the principles and mechanisms of the illustrative embodiments may be used with via fields for connecting any type of integrated circuit element to any particular layer of a MLC substrate. In other words, the principles and mechanisms of the illustrative embodiments may be used anywhere in a MLC substrate where inductance due to the via-field is of concern and a reduction in such would be beneficial. The illustrative embodiments involving a TSM capacitor and connections to VDD and GND planes were provided merely as exemplary and are not intended to state or imply any limitation as to the particular applications of the present invention.

Figure 5:
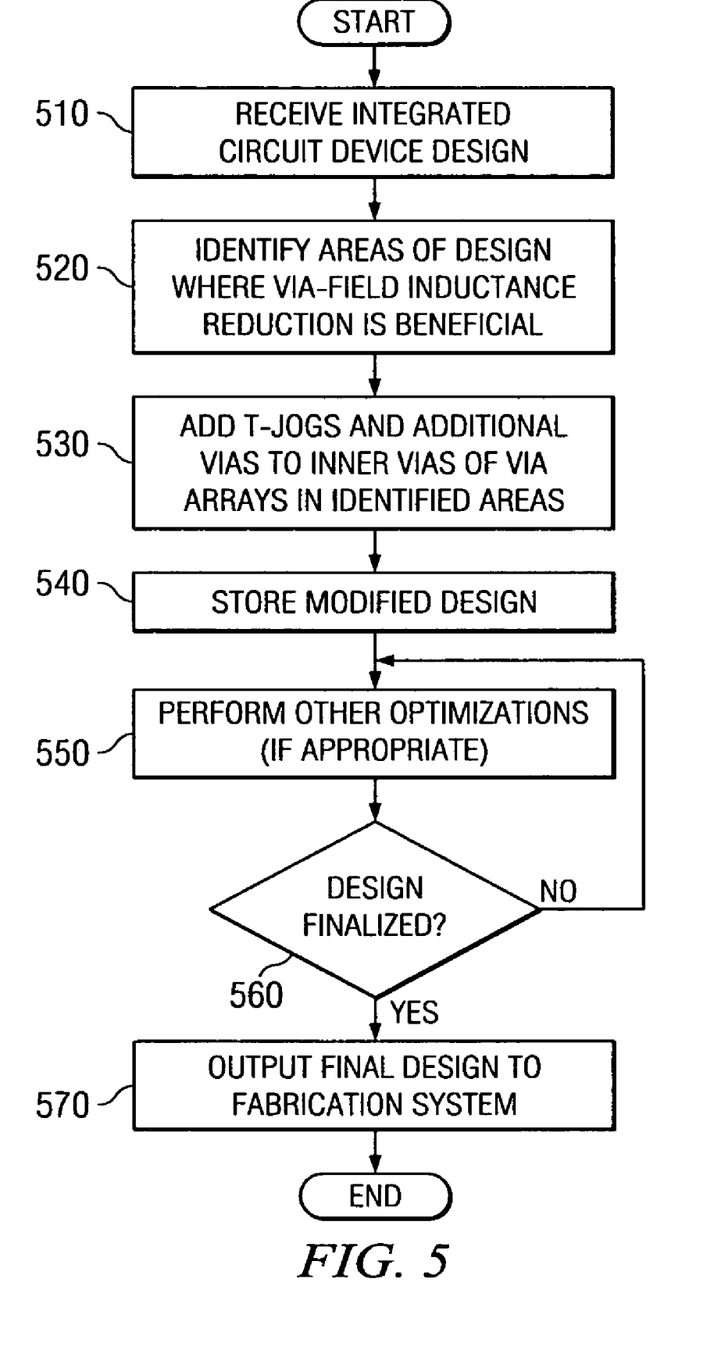
FIG. 5 is a flowchart outlining an exemplary operation for generating T-jog vias in a MLC in accordance with one illustrative embodiment.

FIG. 5 is a flowchart outlining an exemplary operation for generating T-jog vias in a MLC substrate in accordance with one illustrative embodiment. The operation outlined in FIG. 5 may be performed during a design phase of an integrated circuit device fabrication process, for example. As generally known in the art, the design phase of an integrated circuit device fabrication process may involve a designer generating, in a computing device or system, a representation of an integrated circuit device. The resulting design may then be used to control fabrication equipment that use the design to generate a physical integrated circuit device using known fabrication techniques. With the operation of FIG. 5, the operation is used to optimize the design representation in the computing device or system so as to optimize the via arrangement to reduce via-field inductance where appropriate.

As shown in FIG. 5, the operation starts with receiving an integrated circuit device design (step 510). Areas of the design where via-field inductance reduction is beneficial are identified (step 520). Such areas may be identified manually by a designer using the computing device or system upon which the operation of FIG. 5 is being implemented, for example. Alternatively, identification of such areas may be made automatically using design rules and a search engine that searches the integrated circuit device design for areas of the design where the design configuration meet criteria established by the design rules.

T-jogs and additional vias are added to the inner or center vias of via groups or arrays in the identified areas of the design (step 530). The modified design is then stored to a computer readable medium for further optimization or use in fabricating the integrated circuit device (step 540). Other optimizations or design modifications may then be made (step 550) until the design is determined to be in final form. Once the design is finalized (step 560), it may be output to a fabrication system for fabrication of the integrated circuit device (step 570). The operation then terminates.

Thus, the mechanism of the illustrative embodiments provides a via arrangement that reduces the inductance attributed to via-fields. Since the total inductance of an integrated circuit element includes the internal inductance of the element itself, the inductance of the via-field, and the inductance of the power plane, by reducing the via-field inductance, the total inductance for the integrated circuit element is reduced. This is important to various integrated circuit elements including capacitors whose effects are limited by inductance at higher frequencies. Thus, an improved integrated circuit device design is obtained through implementation of the illustrative embodiments.

Figure 6A:
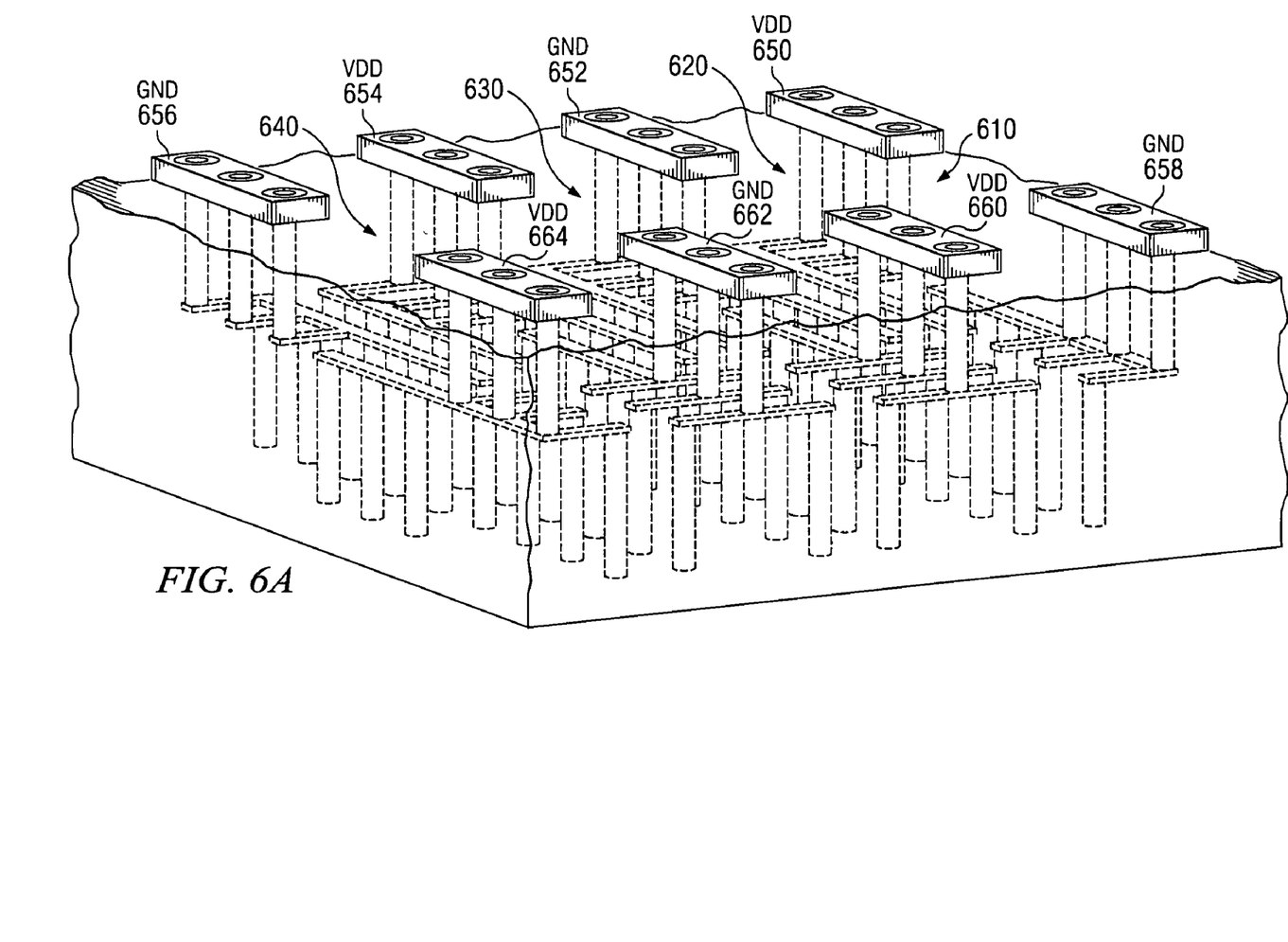
FIGS. 6A and 6B are exemplary diagrams illustrating another illustrative embodiment in which additional vias are provided along an additional dimension of the multilayer ceramic package in the area between the surface pads of the multilayer ceramic package where possible.
Figure 6B:
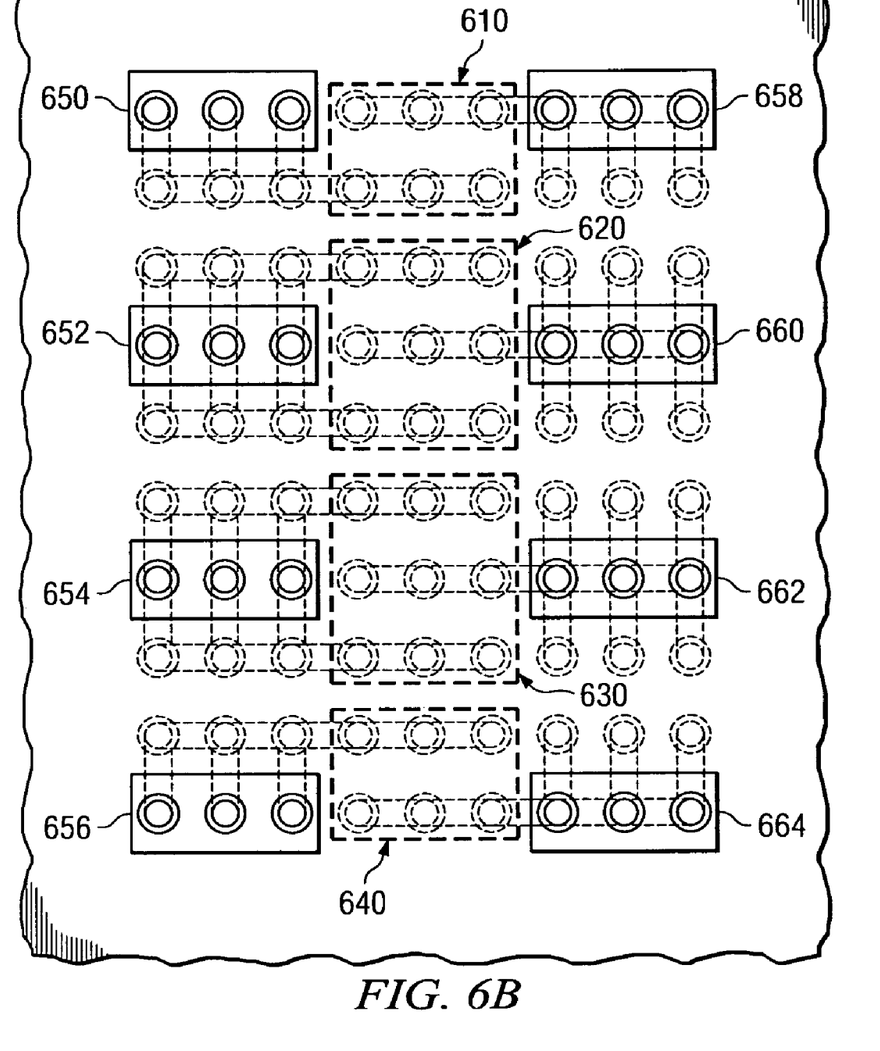

FIGS. 6A and 6B provide conceptual views of another illustrative embodiment in which additional vias are provided in the area between the surface pads of the multilayer ceramic (MLC) substrate where possible. In other words, in the illustrative embodiment shown in FIGS. 4A and 4B, the additional jogs in the vias were provided along one dimension of the MLC substrate. In the alternative illustrative embodiment shown in FIGS. 6A and 6B, additional jogs and vias are provided along a second dimension of the MLC substrate. The direction of the additional jogs in FIGS. 6A and 6B may be perpendicular or orthogonal to the direction of jogs in the vias shown in FIGS. 4A and 4B, for example.

As mentioned previously, inductance is a product of electrical loops and parallel inductances divide. Therefore, the more parallel electrical loops that can be introduced into the via field, and thus, the more parallel inductances that may be introduced, the greater the reduction in the total inductance of the via field may be. The alternative configuration illustrated in FIGS. 6A and 6B aids in reducing the inductance due to the via field by introducing additional parallel electrical loops, i.e. parallel pairs of current paths having opposite directions of current flow, between the surface pads.

As shown in FIGS. 6A and 6B, the vias associated with the internal surface pads 652, 654, 660 and 662 have the same T-jog structure as illustrated in FIGS. 4A and 4B so as to provide additional electrical loops with the single jog vias of surface pads 650, 656, 658 and 664 that are in the same column in the surface pad array. In order to provide additional reduction in the inductance of the via field, additional vias, generally denoted by the reference numerals 610-640, are provided in the area of the multilayer ceramic substrate between the surface pads 650-664 in a same row in the array of surface pads.

These additional vias are created in much the same way as the T-jog vias are created in that an extension of the vias of the surface pads 650-664 in a direction parallel to the layers of the multilayer ceramic substrate is formed, such as in a wiring layer of the multilayer ceramic substrate. This extension of the vias extends out into the area between surface pads 650-664 in a same row of surface pads in the array of surface pads, i.e. in a second dimension of the MLC that is perpendicular or orthogonal to the direction in which the T-jog vias are formed. After having formed the extension of the via in the parallel direction, another portion of the via is generated in a direction perpendicular to the layers of the multilayer ceramic substrate which extends down to an appropriate layer in the multilayer ceramic substrate, e.g., the VDD or GND layer.

As shown in FIGS. 6A and 6B, for some of these additional vias, the additional vias are coupled to the T-jog portions of the vias associated with the surface pads 652 and 654. For the vias associated with surface pads 650, 656, 658, and 664, the additional vias are coupled to the first perpendicular portion of the via extending down from the surface pad to a first wiring layer in the multilayer ceramic package. For the vias associated with surface pads 660 and 662, the additional vias are also coupled to the first perpendicular portion of the via extending down from the surface pads 660 and 662.

It should be noted that it may not always be possible to insert additional vias between the surface pads such as shown in FIGS. 6A and 6B. In some arrangements, other portions of circuitry may be present in these areas and thus, vias may not be formed in these areas. FIGS. 6A and 6B are only meant to illustrate an optimum arrangement of via extensions into the areas between surface pads. In practice, such via extensions, or additional vias, are placed only in those areas where, according to the circuit design, they may be placed without disrupting the operation of the circuitry in the multilayer ceramic package formed using the multilayer ceramic substrate. Thus, some of the additional vias or via extensions 610-640 may not be present in a practical application of the illustrative embodiment. The main concern is to introduce additional current loops where-ever possible in the via field so as to reduce the inductance due to the via field as much as possible.

The resulting integrated circuit generated as a result of the implementation of the illustrative embodiments is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of fabricating an integrated circuit device, comprising:
   receiving an integrated circuit device design;
   identifying at least one portion of the integrated circuit design where a modification of the integrated circuit device design is to be performed in order to reduce via-field inductance;
   modifying the integrated circuit device design, to generate a modified integrated circuit device design, by introducing at least one T-jog configuration in at least one via of the at least one portion of the integrated circuit device design; and
   fabricating the integrated circuit device based on the modified integrated circuit device design by providing a plurality of layers of a substrate and providing a plurality of vias extending through the plurality of layers from a surface of the substrate to designated layers in the plurality of layers, wherein: modifying the integrated circuit design further comprises selecting a wiring layer in a plurality of wiring layers that is closest to the surface of the substrate upon which one or more surface pads, associated with the plurality of vias, are provided for connecting a surface metallization circuit element to the designated layers in the plurality of layers, the at least one via, in the fabricated integrated circuit device, has the T-jog configuration in which the at least one via has two jogs, a first jog of the two jogs is formed, in the fabricated integrated circuit device, in a direction parallel to the plurality of layers towards a first adjacent via of the plurality of vias and a second jog of the two jogs is formed in a direction parallel to the plurality of layers towards a second adjacent via of the plurality of vias, and the first jog and second jog of the T-jog configuration are formed in the selected wiring layer that is closest to the surface of the substrate upon which one or more surface pads, associated with the plurality of vias, are provided.

2. The method of claim 1, wherein the T-jog introduces at least one additional current path in a via field of the substrate that reduces an inductance of the via field.

3. The method of claim 1, further comprising:
   providing a surface metallization circuit element, wherein the plurality of vias are provided in association with one or more surface pads for connecting the surface metallization circuit element to the designated layers in the plurality of layers.

4. The method of claim 3, wherein the surface metallization circuit element is a capacitor.

5. The method of claim 1, wherein the designated layers comprise at least one of a power layer or a ground layer.

6. The method of claim 1, wherein the plurality of vias comprises at least three vias, and wherein the T-jog configuration is associated with an inner via of the at least three vias.

7. A method, in a data processing system, for generating a modified integrated circuit device design for fabricating an integrated circuit device, comprising:
- receiving, in a storage device of the data processing system, an integrated circuit device design;
- identifying, by a computer processor of the data processing system, at least one portion of the integrated circuit device design where a modification of the integrated circuit device design is to be performed in order to reduce via-field inductance;
- modifying, by the computer processor, the integrated circuit device design, to generate a modified integrated circuit device design, by introducing at least one T-jog configuration in at least one via in the at least one portion of the integrated circuit device design; and
- outputting, by the computer processor, the modified integrated circuit device design to a fabrication system to fabricate the integrated circuit device based on the modified integrated circuit device design, wherein: modifying the integrated circuit design further comprises selecting a wiring layer in a plurality of wiring layers that is closest to the surface of the substrate upon which one or more surface pads, associated with the plurality of vias, are provided for connecting a surface metallization circuit element to the designated layers in the plurality of layers, the T-jog configuration has two jogs, wherein a first jog of the two jogs is configured in a direction parallel to substrate layers of the integrated circuit device design towards a first adjacent via of the at least one group of vias and a second jog of the two jogs is formed in a direction parallel to the substrate layers towards a second adjacent via of the at least one group of vias, and the first jog and second jog of the T-jog configuration are formed in the selected wiring layer of the integrated circuit device design.

* * * * *

UNITED STATES PATENT AND TRADEMARK OFFICE
CERTIFICATE OF CORRECTION

| | |
|---|---|
| PATENT NO. | : 7,614,141 B2 |
| APPLICATION NO. | : 11/355713 |
| DATED | : November 10, 2009 |
| INVENTOR(S) | : Douriet et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 329 days.

Signed and Sealed this

Nineteenth Day of October, 2010

David J. Kappos
*Director of the United States Patent and Trademark Office*